(12) United States Patent
Endo et al.

(10) Patent No.: US 7,135,273 B2
(45) Date of Patent: Nov. 14, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 403 days.

(21) Appl. No.: 10/713,217

(22) Filed: Nov. 17, 2003

(65) Prior Publication Data

US 2004/0259040 A1   Dec. 23, 2004

(30) Foreign Application Priority Data

Jun. 23, 2003   (JP) .............................. 2003-177889

(51) Int. Cl.
*G03F 7/20* (2006.01)
(52) U.S. Cl. ....................................... 430/322; 430/311
(58) Field of Classification Search ................ 430/311, 430/322
See application file for complete search history.

(56) References Cited

U.S. PATENT DOCUMENTS

2002/0163629 A1 * 11/2002 Switkes et al. ............... 355/53

OTHER PUBLICATIONS

Hoffnagle et al., "Liquid Immersion Deep-ultraviolet Interferometric Lithography", J. Vac. Sci. Technol. B 17(8), Nov./Dec. 1999, pp. 3306-3309.*
M. Switkes et al., "Immersion Lithography at 157nm", J. Vac. Sci. Technol. B 19(6), pp. 2353-2356, Nov./Dec. 2001.

* cited by examiner

*Primary Examiner*—Kathleen Duda
(74) *Attorney, Agent, or Firm*—McDermott Will & Emery LLP

(57) ABSTRACT

After forming a resist film of a chemically amplified resist material, pattern exposure is carried out by selectively irradiating the resist film with exposing light while supplying, onto the resist film, a solution including a basic compound. After the pattern exposure, the resist film is subjected to post-exposure bake and is then developed with an alkaline developer. Thus, a resist pattern made of an unexposed portion of the resist film can be formed in a good shape.

34 Claims, 8 Drawing Sheets

US 7,135,273 B2

PATTERN FORMATION METHOD

BACKGROUND OF THE INVENTION

The present invention relates to a pattern formation method for use in fabrication process and the like for semiconductor devices.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (M. Switkes and M. Rothschild, "Immersion lithography at 157 nm", J. Vac. Sci. Technol., B19, 2353 (2001)).

In the immersion lithography, a region in an exposure system sandwiched between a projection lens and a resist film formed on a wafer is filled with a solution having a refractive index n, and therefore, the NA (numerical aperture) of the exposure system has a value n·NA. As a result, the resolution of the resist film can be improved.

Now, a first conventional pattern formation method using the immersion lithography will be described with reference to FIGS. 7A through 7D.

First, a positive chemically amplified resist material having the following composition is prepared:

Base polymer: poly((styrenehexafluoroisopropylalcohol)-(α-trifluoromethyl t-butylacrylate)) (wherein styrenehexafluoroisopropylalcohol: α-trifluoromethyl t-butylacrylate=40 mol %:60mol %) . . . 2 g Acid generator: triphenylsulfonium triflate . . . 0.08 g Solvent: propylene glycol monomethyl ether acetate . . . 20 g Next, as shown in FIG. 7A, the aforementioned chemically amplified resist material is applied on a substrate 1 so as to form a resist film 2 with a thickness of 0.35 μm.

Then, as shown in FIG. 7B, while supplying water 3A onto the resist film 2, pattern exposure is carried out by irradiating the resist film 2 with exposing light 4 of ArF excimer laser with NA of 0.65 through a mask 5. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 7C, the resist film 2 is baked with a hot plate at a temperature of 110° C. for 60 seconds, and the resultant resist film is developed with a 2.38 wt % tetramethylammonium hydroxide developer (alkaline developer). In this manner, a resist pattern 6A made of the unexposed portion 2b of the resist film 2 and having a line width of 0.09 μm can be obtained as shown in FIG. 7D.

Next, a second conventional pattern formation method using the immersion lithography will be described with reference to FIGS. 8A through 8D.

First, a positive chemically amplified resist material having the following composition is prepared:

Base polymer: poly((styrenehexafluoroisopropylalcohol)-(α-trifluoromethyl t-butylacrylate)) (wherein styrenehexafluoroisopropylalcohol: α-trifluoromethyl t-butylacrylate=40 mol %:60 mol %) . . . 2 g Acid generator: triphenylsulfonium triflate . . . 0.08 g Solvent: propylene glycol monomethyl ether acetate . . . 20 g Next, as shown in FIG. 8A, the aforementioned chemically amplified resist material is applied on a substrate 1 so as to form a resist film 2 with a thickness of 0.20 μm.

Then, as shown in FIG. 8B, while supplying perfluoropolyether 3B onto the resist film 2, pattern exposure is carried out by irradiating the resist film 2 with exposing light 4 of $F_2$ laser with NA of 0.60 through a mask 5. Thus, an exposed portion 2a of the resist film 2 becomes soluble in an alkaline developer because an acid is generated from the acid generator therein while an unexposed portion 2b of the resist film 2 remains insoluble in an alkaline developer because no acid is generated from the acid generator therein.

After the pattern exposure, as shown in FIG. 8C, the resist film 2 is baked with a hot plate at a temperature of 100° C. for 60 seconds, and the resultant resist film is developed with a 2.38 wt % tetramethylammonium hydroxide developer (alkaline developer). In this manner, a resist pattern 6B made of the unexposed portion 2b of the resist film 2 can be obtained as shown in FIG. 8D.

As shown in FIGS. 7D and 8D, however, each of the resist patterns 6A and 6B formed by the first and second conventional pattern formation methods is in a defective shape. Although the positive chemically amplified resist material is used in the first or second conventional pattern formation method, also when a negative chemically amplified resist material, the resultant resist pattern is in a defective shape.

When a resist pattern in such a defective shape is used for etching a target film, the resultant pattern is also in a defective shape, which disadvantageously lowers the productivity and the yield in the fabrication process for semiconductor devices.

SUMMARY OF THE INVENTION

In consideration of the aforementioned conventional problem, an object of the invention is forming a resist pattern in a good shape by the immersion lithography.

The present inventors have examined the cause of the defective shape of the resist pattern formed by the conventional immersion lithography, resulting in finding the following: A small amount of acid is generated from the acid generator also in the unexposed portion of the resist film because leakage light of the exposing light irradiating the exposed portion of the resist film enters the unexposed portion, and therefore, this small amount of acid slightly changes the solubility of the unexposed portion of the resist film in the developer. Accordingly, the contrast between the exposed portion and the unexposed portion of the resist film is lowered, resulting in forming the resist pattern in the defective shape.

The present invention was devised on the basis of this finding. According to the invention, pattern exposure is carried out while supplying, onto a resist film, a solution that generates a base, so as to suppress the influence of an acid generated owing to leakage light in an unexposed portion of the resist film, and the invention is specifically practiced as follows:

The first pattern formation method of this invention includes the steps of forming a resist film of a chemically amplified resist material; performing pattern exposure by selectively irradiating the resist film with exposing light while supplying, onto the resist film, a solution including a basic compound; and forming a resist pattern by developing the resist film after the pattern exposure.

In the first pattern formation method, since an acid generated in an unexposed portion is neutralized by the basic compound included in the solution, the solubility of the unexposed portion in a developer is not changed. On the other hand, since the amount of acid generated in an exposed portion of the resist film from an acid generator is large, even when the basic compound included in the solution neutralizes the acid generated in the exposed portion, the influence of the neutralization is small, and hence, the solubility of the exposed portion in the developer can be definitely changed. Accordingly, the contrast between the exposed portion and the unexposed portion of the resist film can be largely improved, so that the resist pattern can be formed in a good shape.

Leakage light of the exposing light that enters the unexposed portion of the resist film generates a small amount of acid from the acid generator in a surface portion of the unexposed portion. Therefore, when the pattern exposure is carried out while supplying, onto the resist film, the solution including the basic compound as in the first pattern formation method, the acid generated from the acid generator in the surface portion of the unexposed portion can be more efficiently neutralized by the basic compound as compared with the case where the basic compound is included in the resist film.

In the first pattern formation method, the basic compound included in the solution can be a primary aliphatic amine, a secondary aliphatic amine, a tertiary aliphatic amine, an aromatic amine, an amide derivative, an imide derivative, or a compound having a hydroxyl group and including nitrogen.

The second pattern formation method of this invention includes the steps of forming a resist film of a chemically amplified resist material; performing pattern exposure by selectively irradiating the resist film with exposing light while supplying, onto the resist film, a solution including a basic polymer; and forming a resist pattern by developing the resist film after the pattern exposure.

In the second pattern formation method, since an acid generated in an unexposed portion is neutralized by the basic polymer included in the solution, the solubility of the unexposed portion in a developer is not changed. On the other hand, since the amount of acid generated in an exposed portion of the resist film from an acid generator is large, even when the basic polymer included in the solution neutralizes the acid generated in the exposed portion, the influence of the neutralization is small, and hence, the solubility of the exposed portion in the developer can be definitely changed. Accordingly, the contrast between the exposed portion and the unexposed portion of the resist film can be largely improved, so that the resist pattern can be formed in a good shape.

Leakage light of the exposing light that enters the unexposed portion of the resist film generates a small amount of acid from the acid generator in a surface portion of the unexposed portion. Therefore, when the pattern exposure is carried out while supplying, onto the resist film, the solution including the basic polymer as in the second pattern formation method, the acid generated from the acid generator in the surface portion of the unexposed portion can be more efficiently neutralized by the basic polymer as compared with the case where the basic polymer is included in the resist film.

In the second pattern formation method, the basic polymer included in the solution can be poly-N,N-dimethylaminomethylstyrene, polyaniline, polyethylenimine, polyvinylamine, polyallylamine, polyornithine or polylysine.

The third pattern formation method of this invention includes the steps of forming a resist film of a chemically amplified resist material; performing pattern exposure by selectively irradiating the resist film with exposing light while supplying, onto the resist film, a solution including a compound for generating a base through irradiation with light; and forming a resist pattern by developing the resist film after the pattern exposure.

In the third pattern formation method, since an acid generated in an unexposed portion is neutralized by a base generated from the compound for generating a base included in the solution, the solubility of the unexposed portion in a developer is not changed. On the other hand, since the amount of acid generated in an exposed portion of the resist film from an acid generator is large, even when the base generated from the compound for generating a base included in the solution neutralizes the acid generated in the exposed portion, the influence of the neutralization is small, and hence, the solubility of the exposed portion in the developer can be definitely changed. Accordingly, the contrast between the exposed portion and the unexposed portion of the resist film can be largely improved, so that the resist pattern can be formed in a good shape.

Leakage light of the exposing light that enters the unexposed portion of the resist film generates a small amount of acid from the acid generator in a surface portion of the unexposed portion. Therefore, when the pattern exposure is carried out while supplying, onto the resist film, the solution including the compound for generating a base through irradiation with light as in the third pattern formation method, the acid generated from the acid generator in the surface portion of the unexposed portion can be more efficiently neutralized by the base generated from the compound for generating a base as compared with the case where the compound for generating a base through irradiation with light is included in the resist film.

In the third pattern formation method, the compound for generating a base through irradiation with light included in the solution can be an O-acyl oxime such as O-acryloylacetophenone oxime or O-acryloylacetonaphthone oxime.

The fourth pattern formation method of this invention includes the steps of forming a resist film of a chemically amplified resist material; performing pattern exposure by selectively irradiating the resist film with exposing light while supplying, onto the resist film, a solution including a compound for generating a base through application of heat; and forming a resist pattern by developing the resist film after the pattern exposure.

In the fourth pattern formation method, since an acid generated in an unexposed portion is neutralized by a base generated from the compound for generating a base included in the solution owing to heat caused by light energy, the solubility of the unexposed portion in a developer is not changed. On the other hand, since the amount of acid generated in an exposed portion of the resist film from an acid generator is large, even when the base generated from the compound for generating a base included in the solution owing to the heat caused by the light energy neutralizes the acid generated in the exposed portion, the influence of the neutralization is small, and hence, the solubility of the exposed portion in the developer can be definitely changed. Accordingly, the contrast between the exposed portion and the unexposed portion of the resist film can be largely improved, so that the resist pattern can be formed in a good shape.

Leakage light of the exposing light that enters the unexposed portion of the resist film generates a small amount of acid from the acid generator in a surface portion of the unexposed portion. Therefore, when the pattern exposure is carried out while supplying, onto the resist film, the solution including the compound for generating a base through application of heat as in the fourth pattern formation method, the acid generated from the acid generator in the surface portion of the unexposed portion can be more efficiently neutralized by the base generated from the compound for generating a base through application of heat as compared with the case where the compound for generating a base through application of heat is included in the resist film.

In the fourth pattern formation method, the compound for generating a base through application of heat included in the solution can be an acylsulfonyl such as p-phenacylsulfonylstyrene.

In each of the first through fourth pattern formation methods, the solution can be water or perfluoropolyether.

In each of the first through fourth pattern formation methods, the exposing light can be KrF excimer laser, ArF excimer laser or $F_2$ laser.

DETAILED DESCRIPTION OF THE INVENTION

Embodiment 1

A pattern formation method according to Embodiment 1 of the invention will now be described with reference to FIGS. 1A through 1D.

Figure 1A:
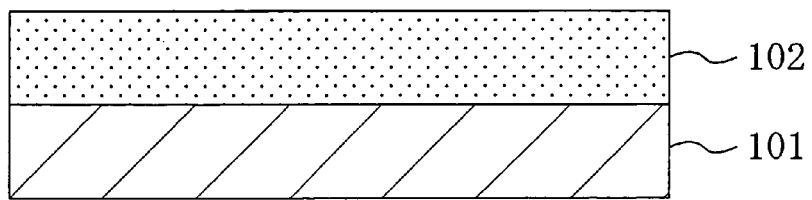
FIGS. 1A, 1B, 1C and 1D are cross-sectional views for showing procedures in a pattern formation method according to Embodiment 1 of the invention.

First, a positive chemically amplified resist material having the following composition is prepared:

Base polymer: poly((styrenehexafluoroisopropylalcohol)-(α-trifluoromethyl t-butylacrylate)) (wherein styrenehexafluoroisopropylalcohol: α-trifluoromethyl t-butylacrylate=40 mol %:60 mol %) . . . 2 g Acid generator: triphenylsulfonium triflate . . . 0.08 g Solvent: propylene glycol monomethyl ether acetate . . . 20 g Next, as shown in FIG. 1A, the aforementioned chemically amplified resist material is applied on a substrate 101 so as to form a resist film 102 with a thickness of 0.35 μm.

Figure 1B:
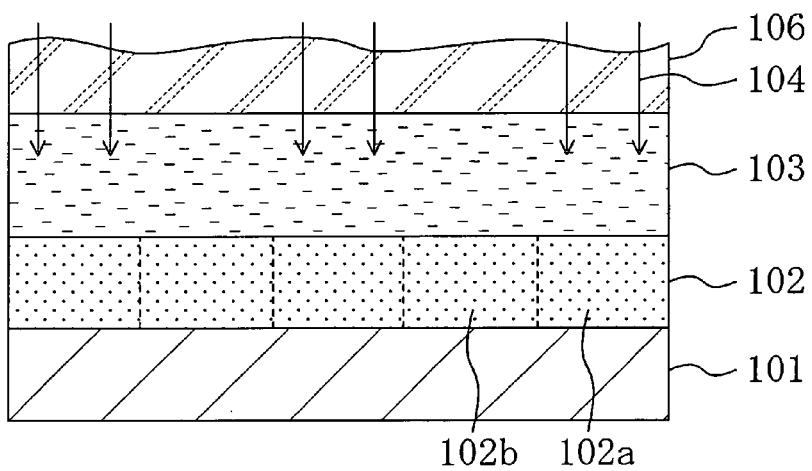

Then, as shown in FIG. 1B, while supplying, onto the resist film 102, a solution 103 of water including 0.01 wt % of triethanolamine (a basic compound), pattern exposure is carried out by irradiating the resist film 102 with exposing light 104 of ArF excimer laser with NA of 0.65 through a mask not shown. In FIG. 1B, a reference numeral 106 denotes a projection lens for condensing the exposing light 104 onto the resist film 102. Thus, an exposed portion 102a of the resist film 102 becomes soluble in an alkaline developer because an acid is generated from the acid generator therein while an unexposed portion 102b of the resist film 102 remains insoluble in an alkaline developer because no acid is generated from the acid generator therein.

Figure 1C:
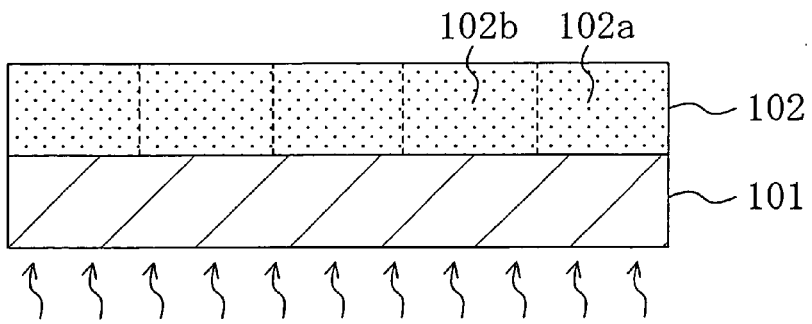
Figure 1D:
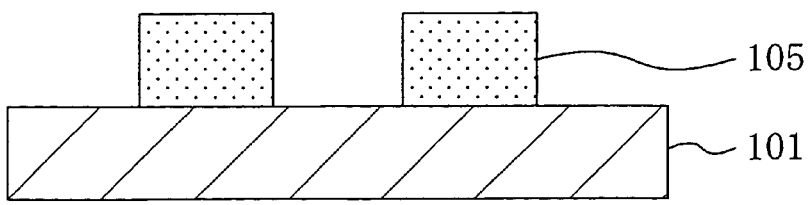

After the pattern exposure, as shown in FIG. 1C, the resist film 102 is baked with a hot plate at a temperature of 110° C. for 60 seconds, and the resultant resist film is developed with a 2.38 wt % tetramethylammonium hydroxide developer (alkaline developer). In this manner, a resist pattern 105 made of the unexposed portion 102b of the resist film 102 and having a line width of 0.09 μm can be formed in a good shape as shown in FIG. 1D.

In Embodiment 1, although a small amount of acid is generated from the acid generator also in the unexposed portion 102b because leakage light of the exposing light 104 enters the unexposed portion 102b of the resist film 102, since the pattern exposure is carried out with the solution 103 including the basic compound supplied onto the resist film 102, the small amount of acid generated in the unexposed portion 102b is neutralized by the basic compound included in the solution 103. Therefore, the unexposed portion 102b remains insoluble in the alkaline developer. On the other hand, since the amount of acid generated from the acid generator in the exposed portion 102a of the resist film 102 is large, even though the acid generated in the exposed portion 102a is neutralized by the basic compound included in the solution 103, the influence of this neutralization is small. Therefore, the exposed portion 102a of the resist film 102 is easily dissolved in the alkaline developer. Accordingly, the contrast between the exposed portion 102a and the unexposed portion 102b of the resist film 102 can be largely improved, resulting in forming the resist pattern 105 in a good shape.

Embodiment 2

A pattern formation method according to Embodiment 2 of the invention will now be described with reference to FIGS. 2A through 2D.

Figure 2A:
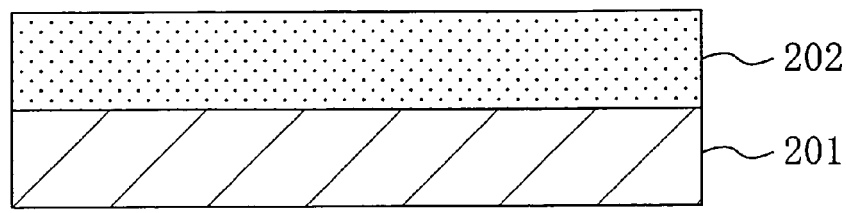
FIGS. 2A, 2B, 2C and 2D are cross-sectional views for showing procedures in a pattern formation method according to Embodiment 2 of the invention.

First, a negative chemically amplified resist material having the following composition is prepared:

Base polymer: poly((styrenehexafluoroisopropylalcohol)-(α-trifluoromethylacrylic acid)) (wherein styenehexafluoroisopropyalchol: α-trifluoromethylacrylic acid=40 mol %:60 mol %) . . . 2 g Crosslinking agent: 1,3,5-N-(dimethoxymethyl) melamine . . . 0.7 g Acid generator: triphenylsulfonium triflate . . . 0.08 g Solvent: propylene glycol monomethyl ether acetate . . . 20 g Next, as shown in FIG. 2A, the aforementioned chemically amplified resist material is applied on a substrate 201 so as to form a resist film 202 with a thickness of 0.35 μm.

Figure 2B:
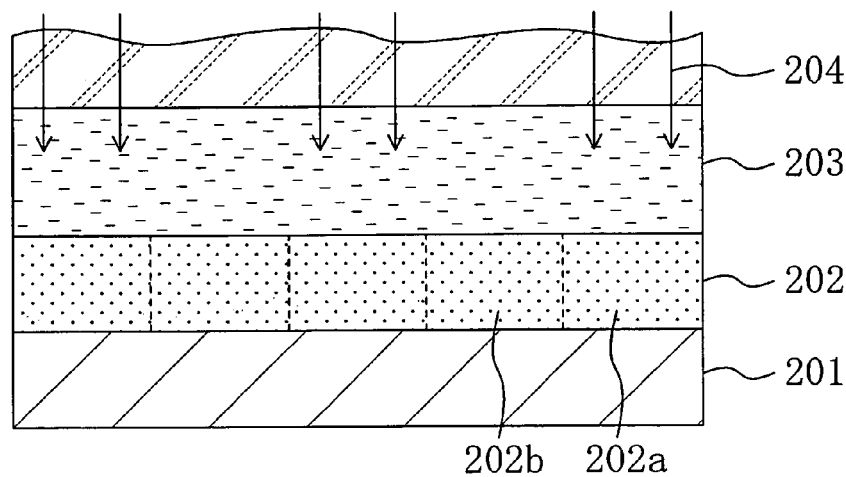

Then, as shown in FIG. 2B, while supplying, onto the resist film 202, a solution 203 of water including 0.02 wt % of trimethylamine (a basic compound), pattern exposure is carried out by irradiating the resist film 202 with exposing light 204 of ArF excimer laser with NA of 0.65 through a mask not shown. Thus, an exposed portion 202a of the resist film 202 becomes insoluble in an alkaline developer due to the function of the crosslinking agent because an acid is generated from the acid generator therein while an unexposed portion 202b of the resist film 202 remains soluble in an alkaline developer because no acid is generated from the acid generator therein.

Figure 2C:
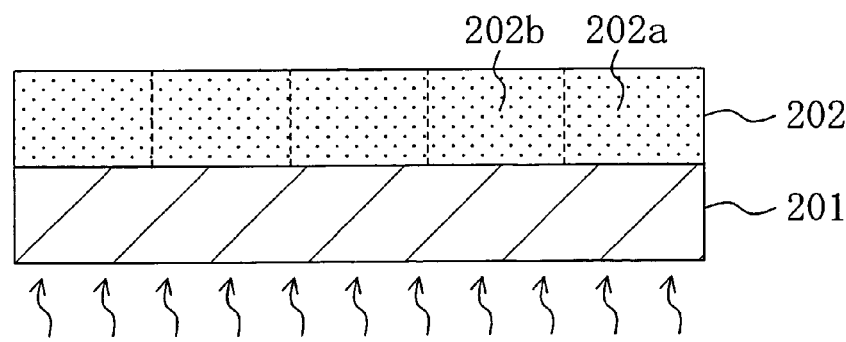
Figure 2D:
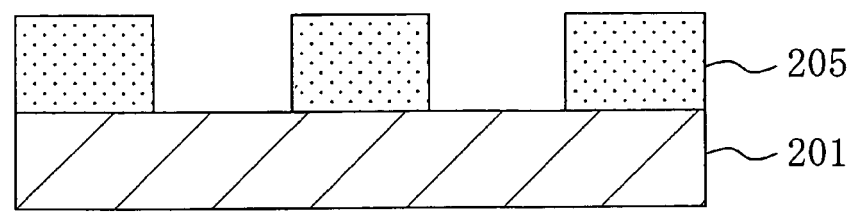

After the pattern exposure, as shown in FIG. 2C, the resist film 202 is baked with a hot plate at a temperature of 120° C. for 60 seconds, and the resultant resist film is developed with a 2.38 wt % tetramethylammonium hydroxide developer (alkaline developer). In this manner, a resist pattern 205 made of the exposed portion 202a of the resist film 202 and having a line width of 0.09 μm can be formed in a good shape as shown in FIG. 2D.

In Embodiment 2, although a small amount of acid is generated from the acid generator also in the unexposed portion 202b because leakage light of the exposing light 204 enters the unexposed portion 202b of the resist film 202, since the pattern exposure is carried out with the solution 203 including the basic compound supplied onto the resist film 202, the small amount of acid generated in the unexposed portion 202b is neutralized by the basic compound included in the solution 203. Therefore, the unexposed portion 202b remains soluble in the alkaline developer. On the other hand, since the amount of acid generated from the acid generator in the exposed portion 202a of the resist film 202 is large, even though the acid generated in the exposed portion 202a is neutralized by the basic compound included in the solution 203, the influence of this neutralization is small. Therefore, the exposed portion 202a of the resist film 202 becomes soluble in the alkaline developer due to the function of the crosslinking agent. Accordingly, the contrast between the exposed portion 202a and the unexposed portion 202b of the resist film 202 can be largely improved, resulting in forming the resist pattern 205 in a good shape.

In each of Embodiments 1 and 2, the basic compound to be included in the solution 103 or 203 can be a primary aliphatic amine, a secondary aliphatic amine, a tertiary aliphatic amine, an aromatic amine, an amide derivative, an imide derivative, a compound having a hydroxyl group and including nitrogen, or the like. The content of the basic compound is generally approximately 0.01 through 0.02 wt %, and may be larger or small than this.

Examples of the primary aliphatic amine usable as the basic compound are ammonia, methylamine, ethylamine, n-propylamine, isopropylamine, n-butylamine and isobutylamine.

Examples of the secondary aliphatic amine usable as the basic compound are dimethylamine, diethylamine, di-n-propylamine, diisopropylamine, di-n-butylamine, diisobutylamine, di-sec-butylamine, dipentylamine, dicyclopentylamine, dihexylamine and dicyclohexylamine.

Examples of the tertiary aliphatic amine usable as the basic compound are trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, dimethylethylamine, methylethylpropylamine, benzylamine, phenetylamine and benzyldimethylamine.

Examples of the aromatic amine usable as the basic compound are diphenyl(p-tolyl)amine, methyldiphenylamine, triphenylamine, phenylenediamine, naphthylamine, diaminonaphthalene, an aniline derivative, a pyrrole derivative, an oxazole derivative, a thiazole derivative, an imidazole derivative, a pyrroline derivative, a pyrrolidine derivative, a pyridine derivative and a quinoline derivative.

Examples of the aniline derivative usable as the basic compound are aniline, N-methylaniline, N-ethylaniline, N-propylaniline, N,N-dimethylaniline, 2-methylaniline, 3-methylaniline, 4-methylaniline, ethylaniline, propylaniline and trimethylaniline.

Examples of the pyrrole derivative usable as the basic compound are pyrrole, 2H-pyrrole, 1-methylpyrrole, 2,4-dimethylpyrrole and N-methylpyrrole.

Examples of the oxazole derivative usable as the basic compound are oxazole and isoxazole.

Examples of the thiazole derivative usable as the basic compound are thiazole and isothiazole.

Examples of the imidazole derivative usable as the basic compound are imidazole and 4-methylimidazole.

Examples of the pyrroline derivative usable as the basic compound are pyrroline and 2-methyl-1-pyrroline.

Examples of the pyrrolidine derivative usable as the basic compound are pyrrolidine, N-methylpyrrolidine and N-methylpyrrolidone.

Examples of the pyridine derivative usable as the basic compound are pyridine, methylpyridine, ethylpyridine, propylpyridine, butylpyridine, 4-(1-butylpentyl)pyridine, dimethylpyridine, trimethylpyridine, triethylpyridine, phenylpyridine, aminopyridine and dimethylaminopyridine.

Examples of the quinoline derivative usable as the basic compound are quinoline and 3-quinolinecarbonitrile.

Examples of the amide derivative usable as the basic compound are formamide, N-methylformamide, N,N-dimethylformamide, acetamide, N-methylacetamide, N,N-dimethylacetamide and benzamide.

Examples of the imide derivative usable as the basic compound are phthalimide, succinimide and maleimide.

Examples of the compound having a hydroxyl group and including nitrogen usable as the basic compound are 2-hydroxypyridine, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 2-(2-hydroxyethyl)pyridine, 1-(2-hydroxyethyl)piperazine, piperidineethanol, 1-(2-hydroxyethyl)pyrrolidine, 1-(2-hydroxyethyl)-2-pyrrolidinone, 3-piperizino-1,2-propanediol, 3-tropanol, 1-methyl-2-pyrrolidineethanol, 1-aziridineethanol and N-(2-hydroxyethyl)phthalimide.

Embodiment 3

A pattern formation method according to Embodiment 3 of the invention will now be described with reference to FIGS. 3A through 3D.

Figure 3A:
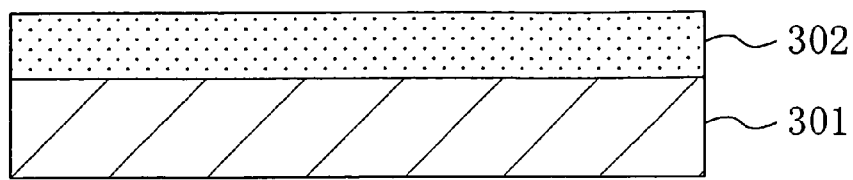
FIGS. 3A, 3B, 3C and 3D are cross-sectional views for showing procedures in a pattern formation method according to Embodiment 3 of the invention.

First, a positive chemically amplified resist material having the following composition is prepared:

Base polymer: poly((styrenehexafluoroisopropylalcohol)-(α-trifluoromethyl t-butylacrylate)) (wherein styrene-hexafluoroisopropylalcohol: α-trifluoromethyl t-butylacrylate=40 mol %:60 mol %) . . . 2 g Acid generator: triphenylsulfonium triflate . . . 0.08 g Solvent: propylene glycol monomethyl ether acetate . . . 20 g Next, as shown in FIG. 3A, the aforementioned chemically amplified resist material is applied on a substrate 301 so as to form a resist film 302 with a thickness of 0.20 μm.

Figure 3B:
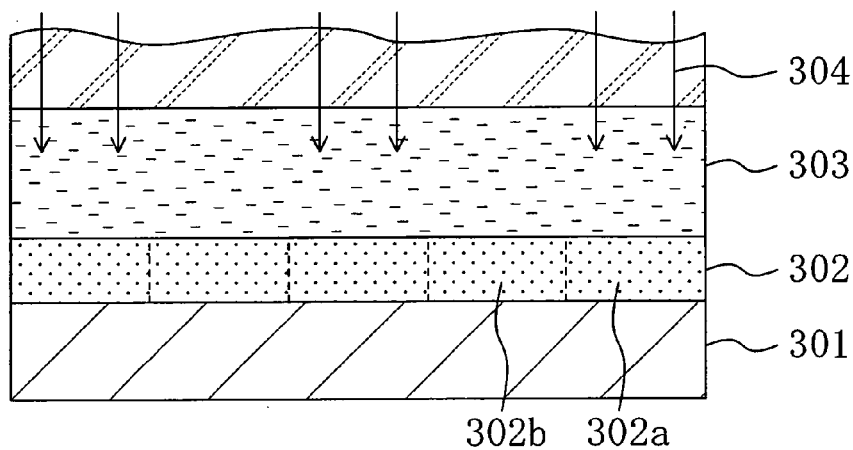

Then, as shown in FIG. 3B, while supplying, onto the resist film 302, a solution 303 of perfluoropolyether (represented by Chemical Formula 1 below) including 0.02 wt % of polyvinylamine (a basic polymer), pattern exposure is carried out by irradiating the resist film 302 with exposing light 304 of $F_2$ laser with NA of 0.60 through a mask not shown. Thus, an exposed portion 302a of the resist film 302 becomes soluble in an alkaline developer because an acid is generated from the acid generator therein while an unexposed portion 302b of the resist film 302 remains insoluble in an alkaline developer because no acid is generated from the acid generator therein.

Chemical Formula I:

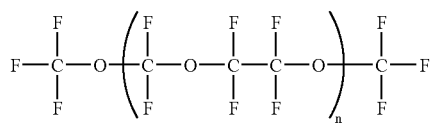

Figure 3C:
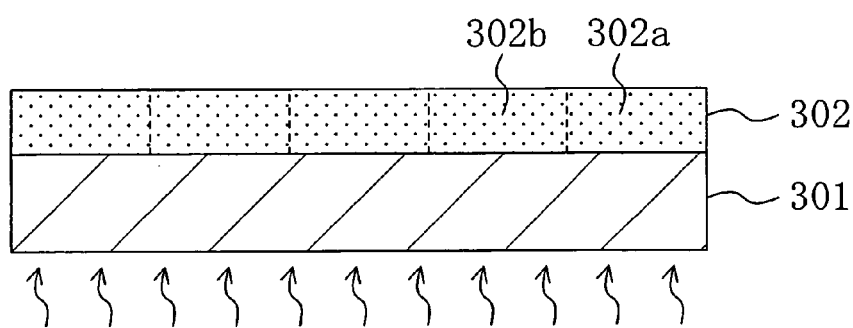
Figure 3D:
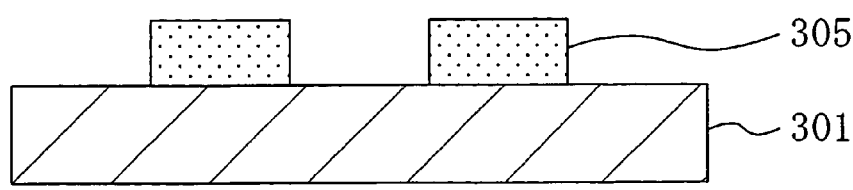

After the pattern exposure, as shown in FIG. 3C, the resist film 302 is baked with a hot plate at a temperature of 100° C. for 60 seconds, and the resultant resist film is developed with a 2.38 wt % tetramethylammonium hydroxide developer (alkaline developer). In this manner, a resist pattern 305 made of the unexposed portion 302b of the resist film 302 and having a line width of 0.06 μm can be formed in a good shape as shown in FIG. 3D.

In Embodiment 3, although a small amount of acid is generated from the acid generator also in the unexposed portion 302b because leakage light of the exposing light 304 enters the unexposed portion 302b of the resist film 302, since the pattern exposure is carried out with the solution 303 including the basic polymer supplied onto the resist film 302, the small amount of acid generated in the unexposed portion 302b is neutralized by the basic polymer included in the solution 303. Therefore, the unexposed portion 302b remains insoluble in the alkaline developer. On the other hand, since the amount of acid generated from the acid generator in the exposed portion 302a of the resist film 302 is large, even though the acid generated in the exposed portion 302a is neutralized by the basic polymer included in the solution 303, the influence of this neutralization is small. Therefore, the exposed portion 302a of the resist film 302 is easily dissolved in the alkaline developer. Accordingly, the contrast between the exposed portion 302a and the unexposed portion 302b of the resist film 302 can be largely improved, resulting in forming the resist pattern 305 in a good shape.

Embodiment 4

A pattern formation method according to Embodiment 4 of the invention will now be described with reference to FIGS. 4A through 4D.

Figure 4A:
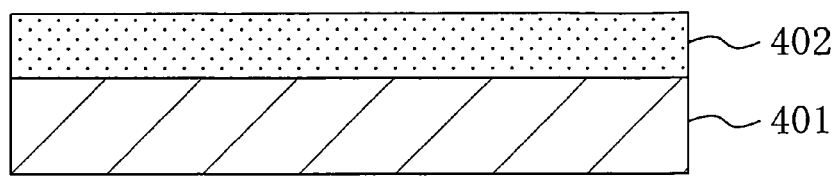
FIGS. 4A, 4B, 4C and 4D are cross-sectional views for showing procedures in a pattern formation method according to Embodiment 4 of the invention.

First, a negative chemically amplified resist material having the following composition is prepared:

Base polymer: poly((styrenehexafluoroisopropylalcohol)-(α-trifluoromethylacrylic acid)) (wherein styrenehexafluoroisopropyl alcohol: α-trifluoromethylacrylic acid=40 mol %:60 mol %) . . . 2 g Crosslinking agent: 1,3,5-N-(dimethoxymethyl) melamine . . . 0.7 g Acid generator: triphenylsulfonium triflate . . . 0.08 g Solvent: propylene glycol monomethyl ether acetate . . . 20 g Next, as shown in FIG. 4A, the aforementioned chemically amplified resist material is applied on a substrate 401 so as to form a resist film 402 with a thickness of 0.20 μm.

Figure 4B:
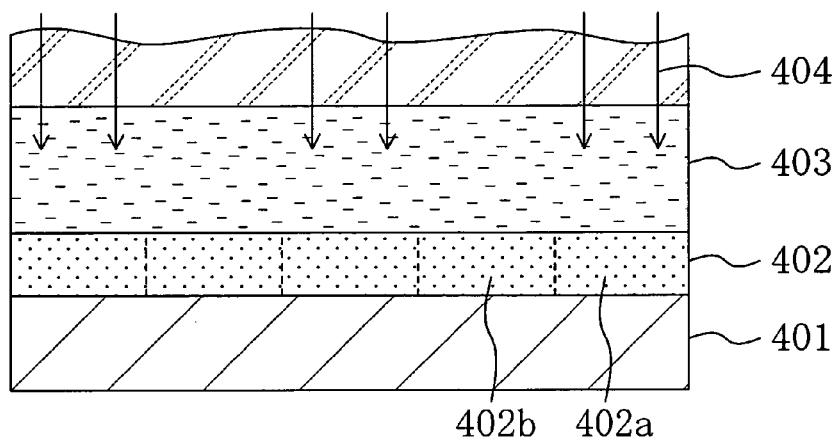

Then, as shown in FIG. 4B, while supplying, onto the resist film 402, a solution 403 of perfluoropolyether including 0.15 wt % of polyaniline (a basic polymer), pattern exposure is carried out by irradiating the resist film 402 with exposing light 404 of $F_2$ laser with NA of 0.60 through a mask not shown. Thus, an exposed portion 402a of the resist film 402 becomes insoluble in an alkaline developer due to the function of the crosslinking agent because an acid is generated from the acid generator therein while an unexposed portion 402b of the resist film 402 remains soluble in an alkaline developer because no acid is generated from the acid generator therein.

Figure 4C:
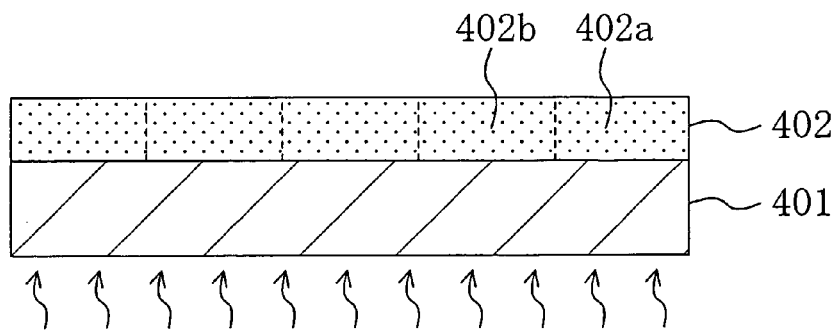
Figure 4D:
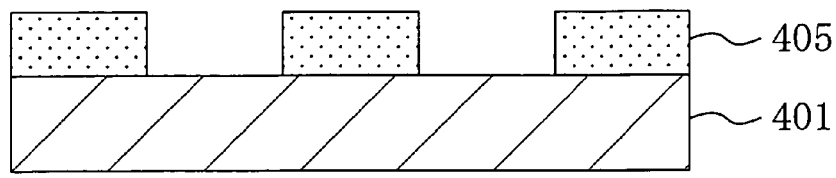

After the pattern exposure, as shown in FIG. 4C, the resist film 402 is baked with a hot plate at a temperature of 110° C. for 60 seconds, and the resultant resist film is developed with a 2.38 wt % tetramethylammonium hydroxide developer (alkaline developer). In this manner, a resist pattern 405 made of the exposed portion 402a of the resist film 402 and having a line width of 0.06 μm can be formed in a good shape as shown in FIG. 4D.

In Embodiment 4, although a small amount of acid is generated from the acid generator also in the unexposed portion 402b because leakage light of the exposing light 404 enters the unexposed portion 402b of the resist film 402, since the pattern exposure is carried out with the solution 403 including the basic polymer supplied onto the resist film 402, the small amount of acid generated in the unexposed portion 402b is neutralized by the basic polymer included in the solution 403. Therefore, the unexposed portion 402b remains soluble in the alkaline developer. On the other hand, since the amount of acid generated from the acid generator in the exposed portion 402a of the resist film 402 is large, even though the acid generated in the exposed portion 402a is neutralized by the basic polymer included in the solution 403, the influence of this neutralization is small. Therefore, the exposed portion 402a of the resist film 402 becomes insoluble in the alkaline developer due to the function of the crosslinking agent. Accordingly, the contrast between the exposed portion 402a and the unexposed portion 402b of the resist film 402 can be largely improved, resulting in forming the resist pattern 405 in a good shape.

In each of Embodiments 3 and 4, the basic polymer to be included in the solution 303 or 403 can be poly-N,N-dimethylaminomethylstyrene, polyaniline, polyethylenimine, polyvinylamine, polyallylamine, polyornithine or polylysine. The content of the basic polymer is generally approximately 0.01 through 0.02 wt %, and may be larger or smaller than this.

Embodiment 5

A pattern formation method according to Embodiment 5 of the invention will now be described with reference to FIGS. 5A through 5D.

Figure 5A:
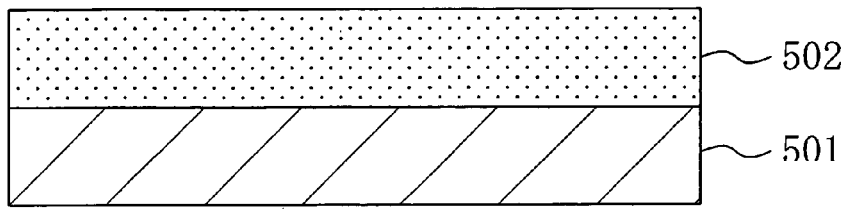
FIGS. 5A, 5B, 5C and 5D are cross-sectional views for showing procedures in a pattern formation method according to Embodiment 5 of the invention.

First, a positive chemically amplified resist material having the following composition is prepared:

Base polymer: poly((styrenehexafluoroisopropylalcohol)-(α-trifluoromethyl t-butylacrylate)) (wherein styrenehexafluoroisopropylalcohol:α-trifluoromethyl t-butylacrylate=40 mol %:60 mol %) . . . 2 g Acid generator: triphenylsulfonium triflate . . . 0.08 g Solvent: propylene glycol monomethyl ether acetate . . . 20 g Next, as shown in FIG. 5A, the aforementioned chemically amplified resist material is applied on a substrate 501 so as to form a resist film 502 with a thickness of 0.35 µm.

Figure 5B:
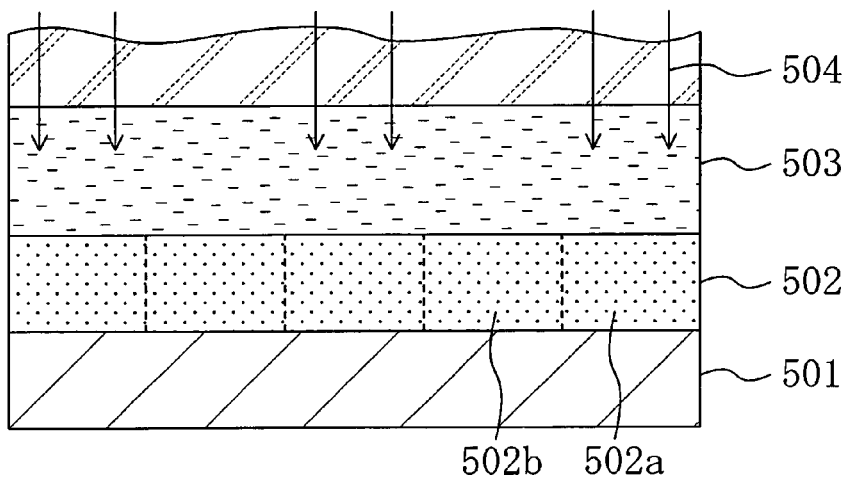

Then, as shown in FIG. 5B, while supplying, onto the resist film 502, a solution 503 of water including 0.15 wt % of O-acryloylacetophenone oxime (a compound for generating a base through irradiation with light), pattern exposure is carried out by irradiating the resist film 502 with exposing light 504 of ArF excimer laser with NA of 0.65 through a mask not shown. Thus, an exposed portion 502a of the resist film 502 becomes soluble in an alkaline developer because an acid is generated from the acid generator therein while an unexposed portion 502b of the resist film 502 remains insoluble in an alkaline developer because no acid is generated from the acid generator therein.

Figure 5C:
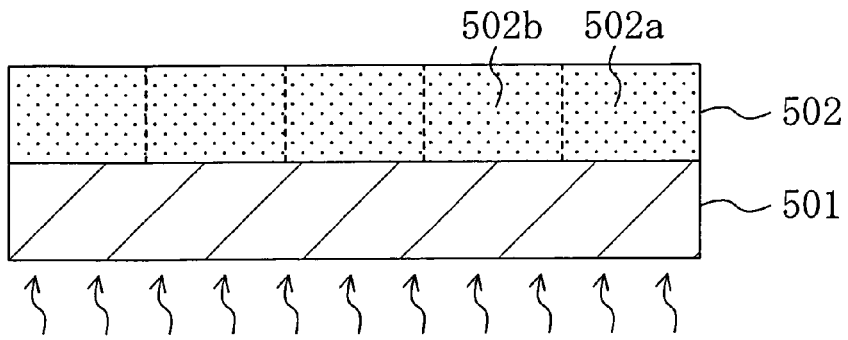
Figure 5D:
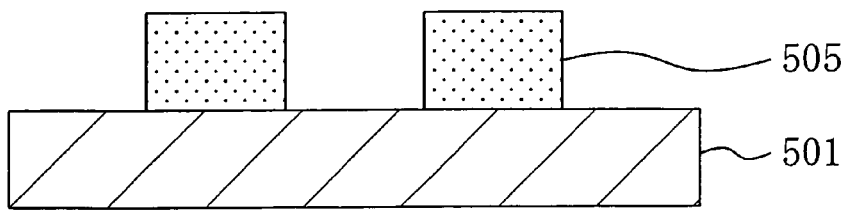

After the pattern exposure, as shown in FIG. 5C, the resist film 502 is baked with a hot plate at a temperature of 110° C. for 60 seconds, and the resultant resist film is developed with a 2.38 wt % tetramethylammonium hydroxide developer (alkaline developer). In this manner, a resist pattern 505 made of the unexposed portion 502b of the resist film 502 and having a line width of 0.09 µm can be formed in a good shape as shown in FIG. 5D.

In Embodiment 5, although a small amount of acid is generated from the acid generator also in the unexposed portion 502b because leakage light of the exposing light 504 enters the unexposed portion 502b of the resist film 502, since the pattern exposure is carried out with the solution 503 including the compound for generating a base through irradiation with light supplied onto the resist film 502, the small amount of acid generated in the unexposed portion 502b is neutralized by the base generated from the compound for generating a base through irradiation with light included in the solution 503. Therefore, the unexposed portion 502b remains insoluble in the alkaline developer. On the other hand, since the amount of acid generated from the acid generator in the exposed portion 502a of the resist film 502 is large, even though the acid generated in the exposed portion 502a is neutralized by the base generated from the compound for generating a base through irradiation with light included in the solution 503, the influence of this neutralization is small. Therefore, the exposed portion 502a of the resist film 502 is easily dissolved in the alkaline developer. Accordingly, the contrast between the exposed portion 502a and the unexposed portion 502b of the resist film 502 can be largely improved, resulting in forming the resist pattern 505 in a good shape.

In Embodiment 5, the compound for generating a base through irradiation with light to be included in the solution 503 can be an O-acyl oxime such as O-acryloylacetophenone oxime or O-acryloylacetonaphthone oxime. The content of the compound for generating a base through irradiation with light is generally approximately 0.01 through 0.02 wt %, and may be larger or smaller than this.

Embodiment 6

A pattern formation method according to Embodiment 6 of the invention will now be described with reference to FIGS. 6A through 6D.

Figure 6A:
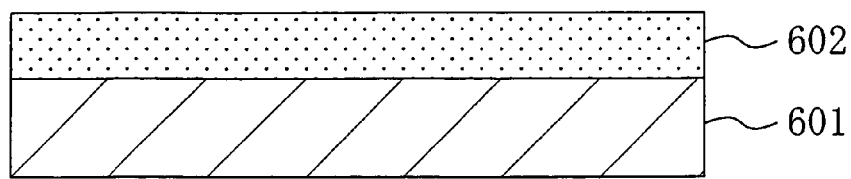
FIGS. 6A, 6B, 6C and 6D are cross-sectional views for showing procedures in a pattern formation method according to Embodiment 6 of the invention.

First, a positive chemically amplified resist material having the following composition is prepared:

Base polymer: poly((styrenehexafluoroisopropylalcohol)-(α-trifluoromethyl t-butylacrylate)) (wherein styrene-hexafluoroisopropylalcohol: α-trifluoromethyl t-butylacrylate=40 mol %:60 mol %) . . . 2 g Acid generator: triphenylsulfonium triflate . . . 0.08 g Solvent: propylene glycol monomethyl ether acetate . . . 20 g Next, as shown in FIG. 6A, the aforementioned chemically amplified resist material is applied on a substrate 601 so as to form a resist film 602 with a thickness of 0.20 µm.

Figure 6B:
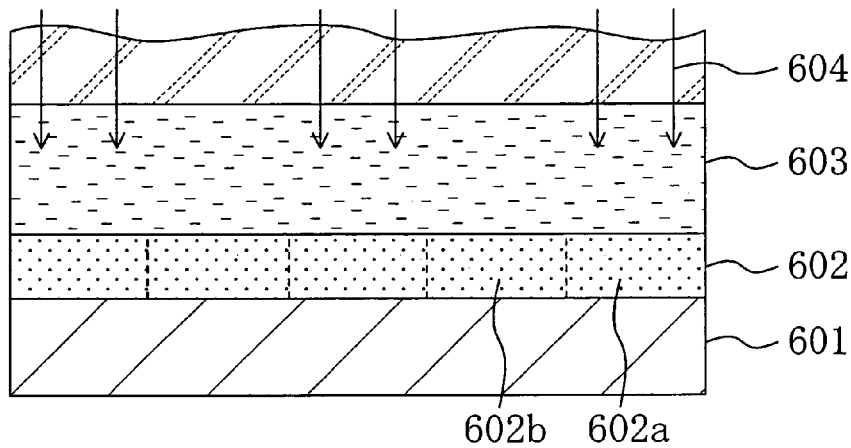

Then, as shown in FIG. 6B, while supplying, onto the resist film 602, a solution 603 of perfluoropolyether including 0.02 wt % of p-phenacylsulfonylstyrene (a compound for generating a base through application of heat), pattern exposure is carried out by irradiating the resist film 602 with exposing light 604 of $F_2$ laser with NA of 0.60 through a mask not shown. Thus, an exposed portion 602a of the resist film 602 becomes soluble in an alkaline developer because an acid is generated from the acid generator therein while an unexposed portion 602b of the resist film 602 remains insoluble in an alkaline developer because no acid is generated from the acid generator therein.

Figure 6C:
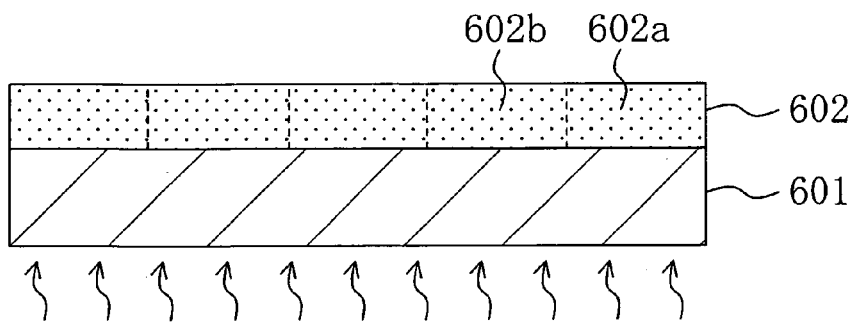
Figure 6D:
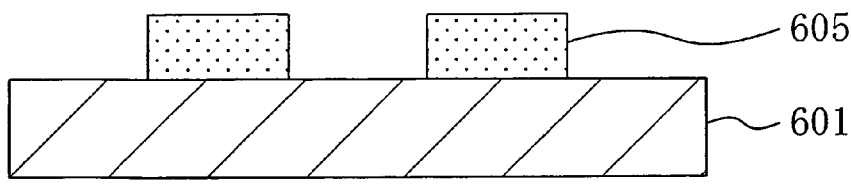
Figure 7A:
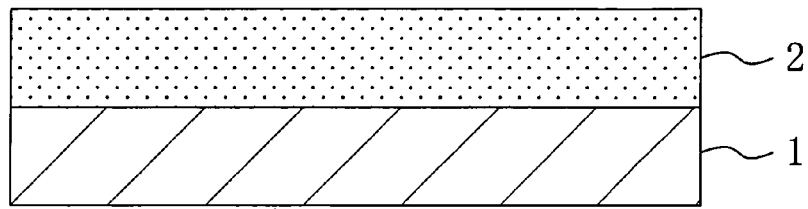
FIGS. 7A, 7B, 7C and 7D are cross-sectional views for showing procedures in a first conventional pattern formation method.
Figure 7B:
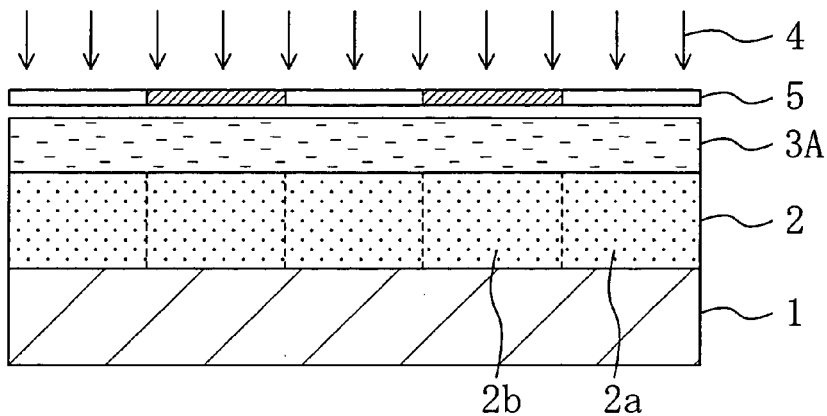
Figure 7C:
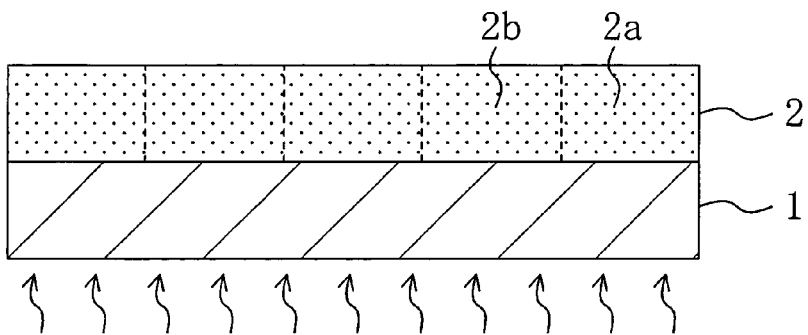
Figure 7D:
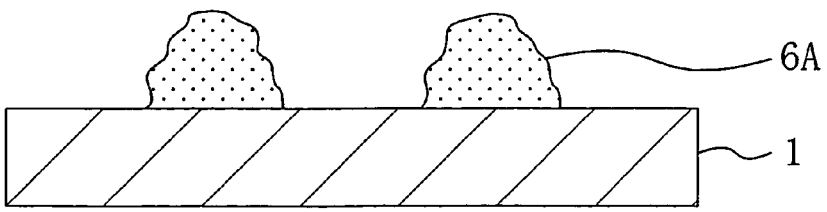
Figure 8A:
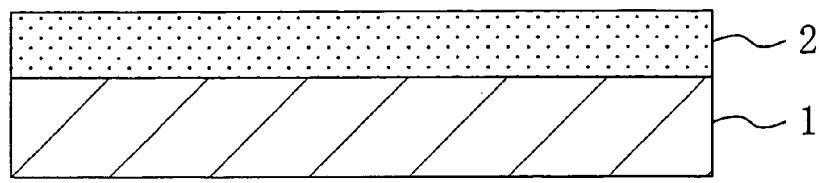
FIGS. 8A, 8B, 8C and 8D are cross-sectional views for showing procedures in a second conventional pattern formation method.
Figure 8B:
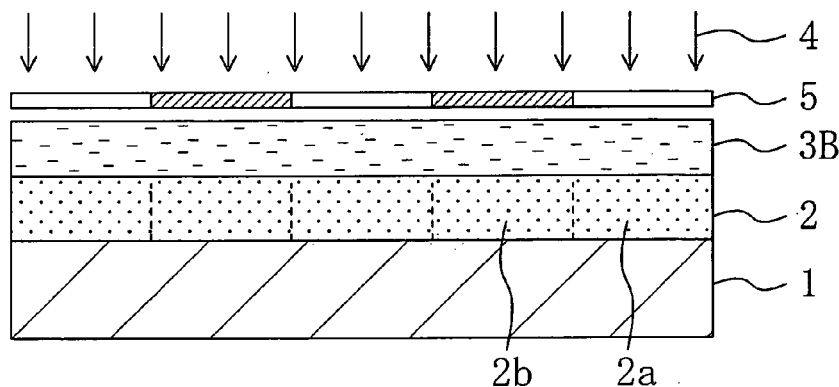
Figure 8C:
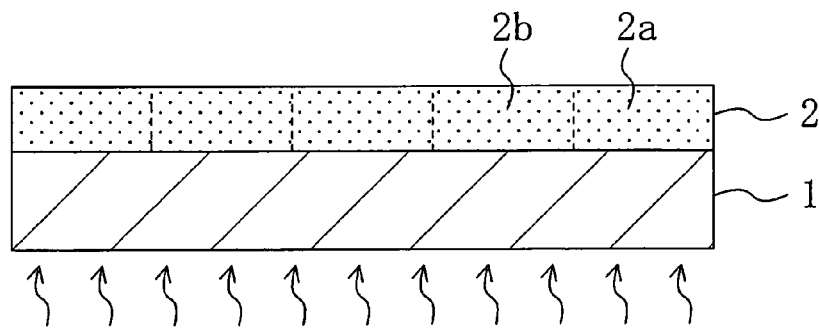
Figure 8D:
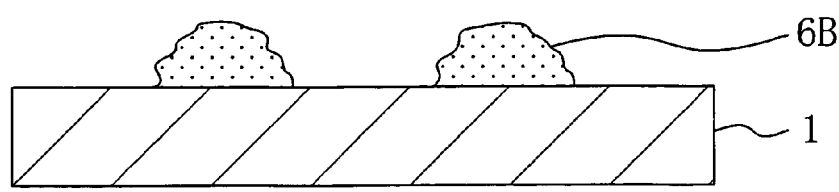

After the pattern exposure, as shown in FIG. 6C, the resist film 602 is baked with a hot plate at a temperature of 100° C. for 60 seconds, and the resultant resist film is developed with a 2.38 wt % tetramethylammonium hydroxide developer (alkaline developer). In this manner, a resist pattern 605 made of the unexposed portion 602b of the resist film 602 and having a line width of 0.06 µm can be formed in a good shape as shown in FIG. 6D.

In Embodiment 6, although a small amount of acid is generated from the acid generator also in the unexposed portion 602b because leakage light of the exposing light 604 enters the unexposed portion 602b of the resist film 602, since the pattern exposure is carried out with the solution 603 including the compound for generating a base through application of heat supplied onto the resist film 602, the small amount of acid generated in the unexposed portion 602b is neutralized by the base generated from the compound for generating a base included in the solution 603 owing to heat caused by light energy. Therefore, the unexposed portion 602b remains insoluble in the alkaline developer. On the other hand, since the amount of acid generated from the acid generator in the exposed portion 602a of the resist film 602 is large, even though the acid generated in the exposed portion 602a is neutralized by the base generated from the compound for generating a base included in the solution 603 owing to the heat caused by the light energy, the influence of this neutralization is small. Therefore, the exposed portion 602a of the resist film 602 is easily dissolved in the alkaline developer. Accordingly, the contrast between the exposed portion 602a and the unexposed portion 602b of the resist film 602 can be largely improved, resulting in forming the resist pattern 605 in a good shape.

In Embodiment 6, the compound for generating a base through application of heat to be included in the solution 603 is not limited to p-phnacylsulfonylstyrene but can be another acylsulfonyl. The content of the compound for generating a base through application of heat is generally approximately 0.01 through 0.02 wt %, and may be larger or smaller than this.

What is claimed is:

1. A pattern formation method comprising the steps of:
    forming a resist film of a chemically amplified resist material;
    performing pattern exposure by selectively irradiating said resist film with exposing light while supplying, onto said resist film, an immersion solution including a basic compound; and forming a resist pattern by developing said resist film after the pattern exposure.

2. The pattern formation method of claim 1, wherein said immersion solution comprises water or perfluoropolyether.

3. The pattern formation method of claim 1, wherein said exposing light is KrF excimer laser, ArF excimer laser, or $F_2$ laser.

4. The pattern formation method of claim 1, wherein said basic compound is a primary aliphatic amine, a secondary aliphatic amine, a tertiary aliphatic amine, an aromatic amine, an amide derivative, an imide derivative, or a compound having a hydroxyl group and including nitrogen.

5. The pattern formation method of claim 1, wherein said basic compound is a primary aliphatic amine such as ammonia, methylamine, ethylamine, n-propylamine, isopropylamine, n-butylamine or isobutylamine.

6. The pattern formation method of claim 1, wherein said basic compound is a secondary aliphatic amine such as dimethylamine, diethylamine, di-n-propylamine, diisopropylamine, di-n-butylamine, diisobutylamine, di-secbutylamine, dipentylamine, dicyclopentylamine, dihexylamine or dicyclohexylamine.

7. The pattern formation method of claim 1, wherein said basic compound is a tertiary aliphatic amine such as trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, dimethylethylamine, methylethylpropylamine, benzylamine, phenetylamine or benzyldimethylamine.

8. The pattern formation method of claim 1, wherein said basic compound is an aromatic amine such as diphenyl(p-tolyl)amine, methyldiphenylamine, triphenylamine, phenylenediamine, naphthylamine, diaminonaphthalene, an aniline derivative, a pyrrole derivative, an oxazole derivative, a thiazole derivative, an imidazole derivative, a pyrroline derivative, a pyrrolidine derivative, a pyridine derivative or a quinoline derivative.

9. The pattern formation method of claim 1, wherein said basic compound is an aniline derivative such as aniline, N-methylaniline, N-ethylaniline, N-propylaniline, N,N-dimethylaniline, 2-methylaniline, 3-methylaniline, 4-methylaniline, ethylaniline, propylaniline or trimethylaniline.

10. The pattern formation method of claim 1, wherein said basic compound is a pyrrole derivative such as pyrrole, 2H-pyrrole, 1-methylpyrrole, 2,4-dimethylpyrrole or N-methylpyrrole.

11. The pattern formation method of claim 1, wherein said basic compound is an oxazole derivative such as oxazole or isoxazole.

12. The pattern formation method of claim 1, wherein said basic compound is a thiazole derivative such as thiazole or isothiazole.

13. The pattern formation method of claim 1, wherein said basic compound is an imidazole derivative such as imidazole or 4-methylimidazole.

14. The pattern formation method of claim 1, wherein said basic compound is a pyrroline derivative such as pyrroline or 2-methyl-1-pyrroline.

15. The pattern formation method of claim 1, wherein said basic compound is a pyrrolidine derivative such as pyrrolidine, N-methylprrolidine or N-methylpyrrolidone.

16. The pattern formation method of claim 1, wherein said basic compound is a pyridine derivative such as pyridine, methylpyridine, ethylpyridine, propylpyridine, butylpyridine, 4-(1-butylpentyl)pyridine, dimethylpyridine, trimethylpyridine, triethylpyridine, phenylpyridine, aminopyridine or dimethylaminopyridine.

17. The pattern formation method of claim 1, wherein said basic compound is a quinoline derivative such as quinoline or 3-quionlinecarbonitrile.

18. The pattern formation method of claim 1, wherein said basic compound is an amide derivative such as formamide, N-methylformamide, N,N-dimethylformamide, acetamide, N-methylacetamide, N,N-dimethylacetamide or benzamide.

19. The pattern formation method of claim 1, wherein said basic compound is an imide derivative such as phthalimide, succinimide or maleimide.

20. The pattern formation method of claim 1, wherein said basic compound is a compound having a hydroxyl group and including nitrogen such as 2-hydroxypyridine, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 2-(2-hydroxyethyl)pyridine, 1-(2-hydroxyethyl)piperazine; piperidineethanol, 1-(2-hydroxyethyl)pyrrolidine, 1-(2-hydroxyethyl)-2-pyrrolidinone, 3-piperizino-1,2-propanediol, 3-tropanol, 1-methyl-2-pyrrolidineethanol, 1-aziridineethanol or N-(2-hydroxyethyl)phthalimide.

21. A pattern formation method comprising the steps of:
forming a resist film of a chemically amplified resist material;
performing pattern exposure by selectively irradiating said resist film with exposing light while supplying, onto said resist film, an immersion solution including a basic polymer; and
forming a resist pattern by developing said resist film after the pattern exposure.

22. The pattern formation method of claim 21, wherein said immersion solution comprises water or perfluoropolyether.

23. The pattern formation method of claim 21, wherein said exposing light is KrF excimer laser, ArF excimer laser, $F_2$ laser, or $F_2$ laser.

24. The pattern formation method of claim 21, wherein said basic polymer is poly-N,N-dimethylaminomethylstyrene, polyaniline, polyethylenimine, polyvinylamine, polyallylamine, polyornithine or polylysine.

25. The pattern formation method comprising the steps of:
forming a resist film of a chemically amplified resist material;
performing pattern exposure by selectively irradiating said resist film with exposing light while supplying, onto said resist film, an immersion solution including a compound for generating a base through irradiation with light; and
forming a resist pattern by developing said resist film after the pattern exposure.

26. The pattern formation method of claim 25, wherein said immersion solution comprises water or perfluoropolyether.

27. The pattern formation method of claim 25,
wherein said exposing light is KrF excimer laser, ArF excimer laser, $F_2$ laser, or $F_2$ laser.

28. The pattern formation method of claim 25,
wherein said compound for generating a base through irradiation with light is an O-acyl oxime.

29. The pattern formation method of claim 25,
wherein said compound for generating a base through irradiation with light is an O-acyl oxime such as O-acryloylacetophenone oxime or O-acryloylacetonaphthone oxime.

30. A pattern formation method comprising the steps of:
forming a resist film of a chemically amplified resist material;
performing pattern exposure by selectively irradiating said resist film with exposing light while supplying, onto said resist film, an immersion solution including a compound for generating a base through application of heat; and
forming a resist pattern by developing said resist film after the pattern exposure.

31. The pattern formation method of claim 30,
wherein said compound for generating a base through application of heat is an acylsulfonyl.

32. The pattern formation method of claim 30,
wherein said compound for generating a base through application of heat is p-phenacylsulfonylstyrene.

33. The pattern formation method of claim 30,
wherein said immersion solution comprises water or perfluoropolyether.

34. The pattern formation method of claim 30,
wherein said exposing light is KrF excimer laser, ArF excimer laser, $F_2$ laser, or $F_2$ laser.

* * * * *